United States Patent
Hu

(10) Patent No.: US 10,651,212 B2
(45) Date of Patent: May 12, 2020

(54) THIN FILM TRANSISTOR ARRAY SUBSTRATE, METHOD FOR MANUFACTURING THE SAME, AND DISPLAY DEVICE

(71) Applicant: BOE TECHNOLOGY GROUP CO., LTD., Beijing (CN)

(72) Inventor: Hehe Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/388,349

(22) Filed: Apr. 18, 2019

(65) Prior Publication Data
US 2019/0244984 A1    Aug. 8, 2019

Related U.S. Application Data

(63) Continuation of application No. 15/322,460, filed as application No. PCT/CN2015/093818 on Nov. 5, 2015, now abandoned.

(30) Foreign Application Priority Data

Nov. 13, 2014    (CN) .......................... 2014 1 0641424

(51) Int. Cl.
*H01L 27/32*    (2006.01)
*H01L 27/12*    (2006.01)
(Continued)

(52) U.S. Cl.
CPC ...... *H01L 27/1288* (2013.01); *H01L 21/0274* (2013.01); *H01L 21/32133* (2013.01);
(Continued)

(58) Field of Classification Search
None
See application file for complete search history.

(56) References Cited

U.S. PATENT DOCUMENTS

2006/0119772 A1    6/2006  Lim et al.
2006/0121634 A1    6/2006  Ahn
(Continued)

FOREIGN PATENT DOCUMENTS

CN         1534366 A       10/2004
CN       101533191 A        9/2009
(Continued)

OTHER PUBLICATIONS

Chinese Office Action for Chinese Patent Application No. 201410641424.6 dated Sep. 28, 2016, 6 pages.
(Continued)

*Primary Examiner* — Benjamin P Sandvik
(74) *Attorney, Agent, or Firm* — Brooks Kushman P.C.

(57) ABSTRACT

A thin film transistor array substrate, a method for manufacturing the same and a display device are provided. The TFT array substrate includes: a substrate, and a gate electrode, a common electrode, a gate insulation layer, an active layer, a source electrode and a drain electrode arranged on the substrate. The TFT array substrate further includes: a pixel electrode, arranged on the gate insulation layer, overlapped with and jointed to the drain electrode; a passivation layer, arranged on the gate insulation layer and a channel between the source and drain electrodes; and a common electrode line, arranged on a plane identical to the pixel electrode.

10 Claims, 7 Drawing Sheets

(51) Int. Cl.
  *H01L 21/82* (2006.01)
  *H01L 27/02* (2006.01)
  *H01L 21/027* (2006.01)
  *H01L 21/3213* (2006.01)
  *H01L 29/423* (2006.01)

(52) U.S. Cl.
  CPC ........ *H01L 21/32139* (2013.01); *H01L 21/82* (2013.01); *H01L 27/02* (2013.01); *H01L 27/124* (2013.01); *H01L 27/1248* (2013.01); *H01L 27/326* (2013.01); *H01L 29/42356* (2013.01)

(56) References Cited

U.S. PATENT DOCUMENTS

| | | | |
|---|---|---|---|
| 2006/0205125 | A1 | 9/2006 | Bae et al. |
| 2007/0205422 | A1 | 9/2007 | Ahn et al. |
| 2008/0173872 | A1 | 7/2008 | Ahn |
| 2008/0213472 | A1 | 9/2008 | Song |
| 2009/0108260 | A1 | 4/2009 | Lin et al. |
| 2010/0003776 | A1 | 1/2010 | Park |
| 2011/0019144 | A1 | 1/2011 | Koh et al. |
| 2011/0156165 | A1 | 6/2011 | Jang et al. |
| 2011/0285931 | A1 | 11/2011 | Kimura et al. |
| 2012/0162162 | A1* | 6/2012 | Kong .................. H01L 27/1288 345/205 |
| 2014/0167031 | A1* | 6/2014 | Choi .................. H01L 21/02565 257/43 |
| 2014/0211120 | A1 | 7/2014 | Yang et al. |
| 2016/0062198 | A1* | 3/2016 | Wang .................. G02F 1/134363 257/72 |

FOREIGN PATENT DOCUMENTS

| | | | |
|---|---|---|---|
| CN | 102983103 | A | 3/2013 |
| CN | 103107133 | A | 5/2013 |
| CN | 104409418 | A | 3/2015 |

OTHER PUBLICATIONS

Written Opinion and International Search Report for International Application No. PCT/CN2015/093818, dated Feb. 14, 2016, 5 pages.
Second Office Action for Chinese Patent Application No. 201410641424.6 dated Mar. 22, 2017, 6 pages.
Third Office Action for Chinese Patent Application No. 201410641424.6 dated Jul. 26, 2017, 3 pages.
Extended European Search Report for European Application No. 15858837.6, dated Mar. 28, 2019, 12 Pages.
Non-Final Rejection for U.S. Appl. No. 15/322,460, dated Jun. 23, 2017, 22 Pages.
Non-Final Rejection for U.S. Appl. No. 15/322,460, dated Feb. 15, 2018, 31 Pages.
Non-Final Rejection for U.S. Appl. No. 15/322,460, dated Oct. 2, 2018, 38 Pages.
Final Rejection for U.S. Appl. No. 15/322,460, dated Oct. 13, 2017, 23 Pages.
Final Rejection for U.S. Appl. No. 15/322,460, dated Jun. 13, 2018, 35 Pages.
$1^{st}$ Chinese Office Action, English Translation.
International Search Report and Written Opinion, English Translation.
CN103107133A, English Abstract and Machine Translation.
CN101533191A, English Abstract and Machine Translation.
CN102983103A, English Abstract and Machine Translation.
CN1534366A, English Abstract and Machine Translation.
CN104409418A, English Abstract Only.

* cited by examiner

THIN FILM TRANSISTOR ARRAY SUBSTRATE, METHOD FOR MANUFACTURING THE SAME, AND DISPLAY DEVICE

CROSS-REFERENCE TO RELATED APPLICATION

This application claims the benefit of and is a continuation of U.S. patent application Ser. No. 15/322,460 filed on Dec. 28, 2016, which is the U.S. national phase of PCT Application No. PCT/CN2015/093818 filed on Nov. 5, 2015, which claims priority to Chinese Patent Application No. 201410641424.6 filed on Nov. 13, 2014, the disclosures of which are incorporated in their entirety by reference herein.

TECHNICAL FIELD

The present disclosure relates to the field of displaying technology, and in particular to a thin film transistor (TFT) array substrate and a method for manufacturing the same, and a display device.

BACKGROUND

In order to achieve a high pixel per inch (PPI) and a high production capacity, it is necessary to reduce sizes of TFTs and reduce the number of masks used in the process of manufacturing the TFTs. At present, the process of manufacturing a TFT array substrate includes processes of using 7 masks, 6 masks, 5 masks and 4 masks. It may be understood that, the fewer the masks used in the manufacturing process of the TFT array substrate, the lower the cost thereof will be.

SUMMARY

In view of this, the present disclosure provides a thin film transistor array substrate, a method for manufacturing the same and a display device, so as to reduce the number of the masks used in the process of manufacturing the TFT array substrate.

To achieve the object hereinabove, a method for manufacturing the TFT array substrate includes: forming, on a substrate, a gate electrode, a common electrode, a gate insulation layer, an active layer and a source and drain metal layer; and forming, on the resultant substrate, a pixel electrode and a passivation layer by one patterning process.

Optionally, the forming, on the resultant substrate, the pixel electrode and the passivation layer by one patterning process includes:

forming a third transparent conductive thin film;

coating photoresist onto the third transparent conductive thin film;

exposing and developing the photoresist by a common mask plate, so as to form a photoresist fully-reserved region and a photoresist fully-unreserved region, where the photoresist fully-reserved region includes a region corresponding to the pixel electrode, a common electrode line and source and drain electrodes, and the photoresist fully-unreserved region includes a region corresponding to a channel between the source and the drain electrodes and the passivation layer;

etching the third transparent conductive thin film at the photoresist fully-unreserved region, so as to form the pixel electrode, the common electrode line and a source electrode protective portion, where the source electrode protective portion covers the source electrode, and the pixel electrode covers the drain electrode;

etching the source and drain metal layer at the photoresist fully-unreserved region, so as to form the source and the drain electrodes, where the pixel electrode is overlapped with and jointed to the drain electrode;

forming a passivation layer thin film; and peeling off the photoresist at the photoresist fully-reserved region, so as to form the passivation layer.

Optionally, the forming on the substrate, the gate electrode, the common electrode, the gate insulation layer, the active layer and the source and drain metal layer includes: forming, on the substrate, the gate electrode, the common electrode, and a common electrode line connection portion by one patterning process.

Optionally, the forming, on the substrate, the gate electrode, the common electrode, and the common electrode line connection portion by one patterning process includes:

forming, on the substrate, a first transparent conductive thin film, a gate metal thin film and a second transparent conductive thin film in sequence;

coating photoresist onto the second transparent conductive thin film;

exposing and developing the photoresist with a grey tone mask plate or a half tone mask plate, so as to form a photoresist fully-reserved region, a photoresist partially-reserved region and a photoresist fully-unreserved region, where the photoresist fully-reserved region includes a region corresponding to the gate electrode and the common electrode line connection portion, the photoresist partially-reserved region includes a region corresponding to the common electrode, and the photoresist fully-unreserved region includes a region other than the photoresist fully-reserved region and the photoresist partially-reserved region;

removing the first transparent conductive thin film, the gate metal thin film and the second transparent conductive thin film at the photoresist fully-unreserved region by an etching process;

removing the photoresist at the photoresist partially-reserved region by an ashing process;

removing the gate metal thin film and the second transparent conductive thin film at the photoresist partially-reserved region by an etching process, so as to form the common electrode; and peeling off the photoresist at the photoresist fully-reserved region, so as to expose the gate electrode and the common electrode line connection portion.

Optionally, the forming on the substrate, the gate electrode, the common electrode, the gate insulation layer, the active layer and the source and drain metal layer further includes: forming the gate insulation layer, the active layer and the source and drain metal layer by one patterning process.

Optionally, the forming the gate insulation layer, the active layer and the source and drain metal layer by one patterning process includes:

forming a gate insulation thin film, an active layer thin film and a source and drain metal thin film in sequence;

coating photoresist onto the source and drain metal thin film;

exposing and developing the photoresist with a grey tone mask plate or a half tone mask plate, so as to form a photoresist fully-reserved region, a photoresist partially-reserved region and a photoresist fully-unreserved region, where the photoresist fully-reserved region includes a region corresponding to the active layer, the photoresist fully-unreserved region includes a region corresponding to the common electrode line connection portion, and the photoresist partially-reserved region includes a region other than the photoresist fully-reserved region and the photoresist fully-unreserved region;

removing the gate insulation thin film, the active layer thin film and the source and drain metal thin film at the photoresist fully-unreserved region by an etching process;

removing the photoresist at the photoresist partially-reserved region by an ashing process;

removing the source and drain metal thin film and the active layer thin film at the photoresist partially-reserved region by an etching process, so as to form the gate insulation layer; and peeling off the photoresist at the photoresist fully-reserved region, so as to expose the source and drain metal layer and the active layer.

A thin film transistor (TFT) array substrate is further provided, including: a substrate, and a gate electrode, a common electrode, a gate insulation layer, an active layer, a source electrode and a drain electrode arranged on the substrate; a pixel electrode, arranged on the gate insulation layer and overlapped with and jointed to the drain electrode; and a passivation layer, arranged on the gate insulation layer and a channel between the source and the drain electrode.

Optionally, the TFT array substrate further includes: a common electrode line, arranged at a layer and made of a material identical to the pixel electrode.

Optionally, the gate electrode and the common electrode are arranged on the substrate, and the TFT array substrate further includes:

a transparent conductive thin film protective portion, arranged between the gate electrode and the substrate and arranged at a layer and made of a material identical to the common electrode;

a common electrode line connection portion, arranged on the common electrode and including a first transparent conductive layer and a gate metal layer, where the common electrode is connected to the corresponding common electrode line via the common electrode line connection portion.

Optionally, the TFT array substrate further includes: a gate electrode protective layer, arranged between the gate electrode and the gate insulation layer, where the common electrode line connection portion further includes a second transparent conductive layer arranged at a layer and made of a material identical to the gate electrode protective layer.

Optionally, the TFT array substrate further includes: a source electrode protective portion arrange on the source electrode and arranged at a layer and made of a material identical to the pixel electrode.

According to the present disclosure, the pixel electrode and the passivation layer may be formed by one patterning process, thereby reducing the number of the masks used in the process of manufacturing the TFT array substrate and reducing the production cost.

BRIEF DESCRIPTION OF THE DRAWINGS

FIGS. 2-1 to 2-7 show a process of forming a gate insulation layer, an active layer and a source-drain metal layer by one patterning process in some embodiments of the present disclosure;

FIGS. 3-1 to 3-7 show a process of forming a pixel electrode, a common electrode line, source-drain electrodes and a passivation layer by one patterning process in some embodiments of the present disclosure; and FIG. 4 is a schematic view of a TFT array substrate in some embodiments of the present disclosure.

DETAILED DESCRIPTION

Figure 1:
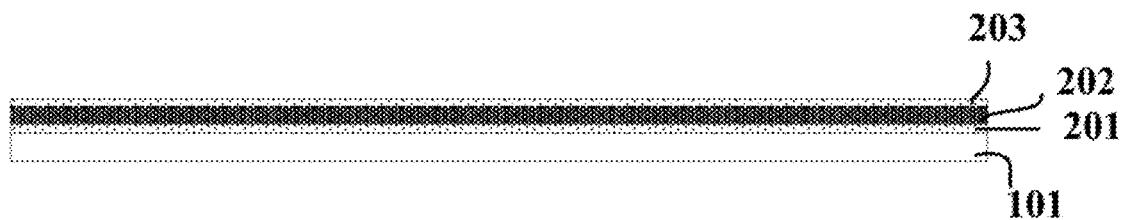
FIGS. 1-1 to 1-7 show a process of forming a gate electrode, a common electrode and a common electrode line connection portion on a substrate by one patterning process in some embodiments of the present disclosure.
Figures 1, 2:
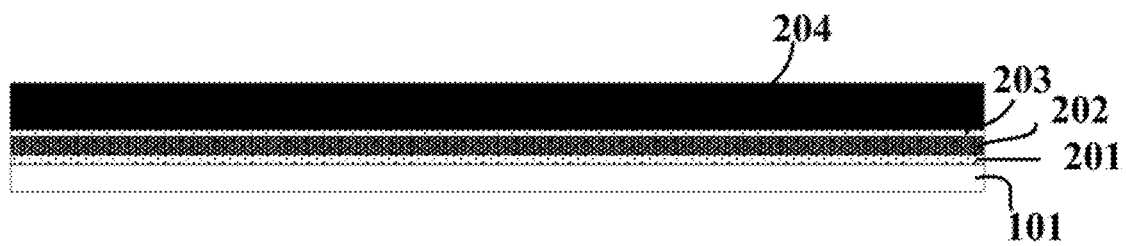
Figures 1, 2, 3:
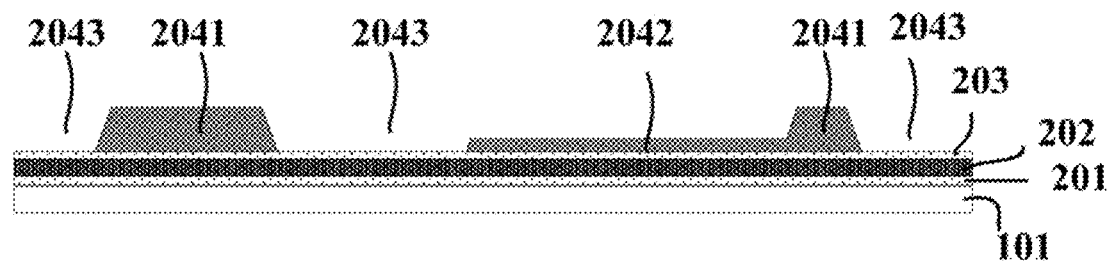

In order to make the technical issues, the technical solutions and the advantages of the present disclosure more apparent, the present disclosure will be described hereinafter in details in conjunction with the drawings and embodiments.

According to a method for manufacturing a TFT array substrate in the related art, after source-drain electrodes are formed, a passivation (PVX) layer is generally deposited onto the source-drain electrodes, and via-holes are formed in the passivation layer by one patterning process. Then, a transparent conductive thin film is formed on the passivation layer, and a pixel electrode is formed by one patterning process. Each pixel electrode is connected to the corresponding drain electrode through the via-hole. In other words, two masks are required to form the passivation layer and the pixel electrode in the process of manufacturing the TFT array substrate in the related art.

In order to reduce the number of the masks used in the process of manufacturing the TFT array substrate, a method for manufacturing a TFT array substrate is provided in the present disclosure, including:

Step S1: forming, on a substrate, a gate electrode, a common electrode, a gate insulation layer, an active layer and a source-drain metal layer; and Step S2: forming, on the substrate on which the gate electrode, the common electrode, the gate insulation layer, the active layer and the source-drain metal layer are formed, a pixel electrode and a passivation layer by one patterning process.

According to the method in some embodiments of the present disclosure, the pixel electrode and the passivation layer may be formed by one patterning process, thereby reducing the number of the masks used in the process of manufacturing the TFT array substrate and reducing the production cost.

The step of forming the pixel electrode and the passivation layer by one patterning process will be described in details hereinafter.

At Step S1, the source-drain metal layer may cover completely a channel between source-drain electrodes, i.e., the channel between the source-drain electrodes is not formed. Optionally, the source-drain metal layer may not cover the channel between the source and drain electrodes, i.e., the channel between the source-drain electrodes is formed.

At Step S1, when the source-drain metal layer covers completely the channel between the source and drain electrodes, the step of forming the pixel electrode and the passivation layer by one patterning process includes following steps.

Step S211 is to form a third transparent conductive thin film. The third transparent conductive thin film may be an indium tin oxide (ITO) or an indium zinc oxide (IZO) conductive thin film.

Step S212 is to coat photoresist onto the third transparent conductive thin film.

Step S213 is to expose and develop the photoresist by a common mask plate, so as to form a photoresist fully-reserved region and a photoresist fully-unreserved region. The photoresist fully-reserved region includes a region corresponding to the pixel electrode, a common electrode line and the source-drain electrodes. The photoresist fully-unreserved region includes a region corresponding to the channel between the source and the drain electrodes and the passivation layer.

Step S214 is to etch the third transparent conductive thin film at the photoresist fully-unreserved region, so as to form the pixel electrode, the common electrode line and a source electrode protective portion. The source electrode protective portion covers the source electrode. The pixel electrode covers the drain electrode.

Step S215 is to etch the source-drain metal layer at the photoresist fully-unreserved region, so as to form the source and the drain electrodes.

In Step S215, since the source electrode protective portion covers the source electrode, so the source-drain metal layer at the region of the source electrode may not be etched. Since the pixel electrode covers the drain electrode, so the source-drain metal layer at the region of the drain electrode may not be etched.

Step S216 is to form a passivation layer thin film.

Step S217 is to peel off the photoresist at the photoresist fully-reserved region, so as to form the passivation layer.

In some embodiments of the present disclosure, the pixel electrode and the common electrode line are formed simultaneously, i.e., the pixel electrode and the common electrode line are formed on the same plane, and thus it is easy to achieve lap joints of the pixel electrode and the common electrode when bright points occur, so as to turn the bright points into dark points.

Of course, in some embodiments of the present disclosure, the pixel electrode and the common electrode line may not be formed simultaneously. Then, in Step S213, the photoresist fully-reserved region merely includes a region corresponding to the pixel electrode and the source and drain electrodes, and does not include a region corresponding to the common electrode line.

In the embodiments of the present disclosure, after the source-drain metal layer is formed, the pixel electrode is formed firstly and then the passivation layer thin film is formed without peeling off the photoresist. Then, the photoresist at the photoresist fully-reserved region is peeled off, such that the passivation layer thin film on this part of the photoresist is removed accordingly. The passivation layer thin film at the photoresist fully-unreserved region forms the passivation layer which covers and protects a region not covered by the transparent conductive thin film. It can be seen that, in the embodiment of the present disclosure, the pixel electrode and the passivation layer may be formed by merely one patterning process, thereby reducing the number of the masks used in the process of manufacturing the TFT array substrate and reducing the production cost.

In Step S1, when the source-drain metal layer does not cover the channel between the source and drain electrode, i.e., the channel between the source and drain electrode is formed, the step of forming the pixel electrode and the passivation layer by one patterning process includes the following steps.

Step S221 is to form a third transparent conductive thin film. The third transparent conductive thin film may be an ITO or an IZO conductive thin film.

Step S222 is to coat photoresist onto the third transparent conductive thin film.

Step S223 is to expose and develop the photoresist by a common mask plate, so as to form a photoresist fully-reserved region and a photoresist fully-unreserved region. The photoresist fully-reserved region includes a region corresponding to the pixel electrode and a common electrode line. The photoresist fully-unreserved region includes a region corresponding to the passivation layer.

Step S224 is to etch the third transparent conductive thin film at the photoresist fully-unreserved region, so as to form the pixel electrode and the common electrode line.

Step S225 is to form a passivation layer thin film.

Step S226 is to peel off the photoresist at the photoresist fully-reserved region, so as to form the passivation layer.

In some embodiments of the present disclosure, the pixel electrode and the common electrode line are formed simultaneously, i.e., the pixel electrode and the common electrode line are formed on the same plane, and thus it is easy to achieve lap joints of the pixel electrode and the common electrode when the bright points occur, so as to turn the bright points into dark points.

Of course, in some embodiments of the present disclosure, the pixel electrode and the common electrode line may not be formed simultaneously. Then, in Step S223, the photoresist fully-reserved region merely includes a region corresponding to the pixel electrode and source and drain electrodes, and does not include a region corresponding to the common electrode line.

In the embodiments of the present disclosure, after the source-drain metal layer is formed, the pixel electrode is formed firstly and then the passivation layer thin film is formed without peeling off the photoresist. Then, the photoresist at the photoresist fully-reserved region is peeled off, such that the passivation layer thin film on this part of the photoresist is removed accordingly. The passivation layer thin film at the photoresist fully-unreserved region forms the passivation layer which covers and protects a region not covered by the transparent conductive thin film. It can be seen that, in the embodiment of the present disclosure, the pixel electrode and the passivation layer may be formed by merely one patterning process, thereby reducing the number of the masks used in the process of manufacturing the TFT array substrate and reducing the production cost.

In Step S1 hereinabove, the gate electrode, the common electrode, the gate insulation layer, the active layer and the source-drain metal layer may be formed on the substrate by a method in the related art. In order to further reduce the number of the masks, the gate electrode, the common electrode, the gate insulation layer, the active layer and the source-drain metal layer may be formed on the substrate by the method in the embodiments of the present disclosure hereinafter.

For example, the gate electrode, the common electrode, and a common electrode line connection portion may be formed by one patterning process.

To be specific, the step of forming, on the substrate, the gate electrode, the common electrode, and the common electrode line connection portion by one patterning process may include the following steps.

Step S111 is to form, on the substrate, a first transparent conductive thin film, a gate metal thin film and a second transparent conductive thin film in sequence. The first and second transparent conductive thin films may be ITO or IZO conductive thin films.

Step S112 is to coat photoresist onto the second transparent conductive thin film.

Step S113 is to expose and develop the photoresist by a grey tone mask plate or a half tone mask plate, so as to form a photoresist fully-reserved region, a photoresist partially-reserved region and a photoresist fully-unreserved region.

The photoresist fully-reserved region includes a region corresponding to the gate electrode and the common electrode line connection portion. The photoresist partially-reserved region includes a region corresponding to the common electrode. The photoresist fully-unreserved region includes a region other than the photoresist fully-reserved region and the photoresist partially-reserved region.

The common electrode line connection portion formed in Step S113 is configured to connect the common electrode to the common electrode line. The common electrode line is formed in a plane identical to the pixel electrode and formed simultaneously with the pixel electrode.

Step S114 is to remove the first transparent conductive thin film, the gate metal thin film and the second transparent conductive thin film at the photoresist fully-unreserved region by an etching process.

Step S115 is to remove the photoresist at the photoresist partially-reserved region by an ashing process.

Step S116 is to remove the gate metal thin film and the second transparent conductive thin film at the photoresist partially-reserved region by an etching process, so as to form the common electrode.

Step S117 is to peel off the photoresist at the photoresist fully-reserved region, so as to expose the gate electrode and the common electrode line connection portion.

In the embodiment hereinabove, when the gate electrode is formed, a gate electrode protective layer, which is formed by the reserved second transparent conductive thin film, may be formed on the gate electrode, so as to protect the gate electrode in the subsequent step of etching the source-drain metal layer. Of course, if the etching process of the source-drain metal layer can be controlled well, it is unnecessary to form such gate electrode protective layer. Then, in Step S111, it is merely required to form the first transparent conductive thin film and the gate metal thin film, without forming the second transparent conductive thin film.

Of course, when the common electrode line is arranged at a plane different from the pixel electrode, merely the gate electrode and the common electrode may be formed on the substrate by one patterning process. Then, the photoresist fully-reserved region formed in Step S113 merely includes a region corresponding to the gate electrode.

In order to further reduce the number of the masks, the gate insulation layer, the active layer and the source-drain metal layer may be formed by one patterning process in some embodiments of the present disclosure.

To be specific, the step of forming the gate insulation layer, the active layer and the source-drain metal layer by one patterning process may include the following steps.

Step S121 is to form a gate insulation thin film, an active layer thin film and a source-drain metal thin film in sequence.

Step S122 is to coat photoresist onto the source-drain metal thin film.

Step S123 is to expose and develop the photoresist by a grey tone mask plate or a half tone mask plate, so as to form a photoresist fully-reserved region, a photoresist partially-reserved region and a photoresist fully-unreserved region. The photoresist fully-reserved region includes a region corresponding to the active layer. The photoresist fully-unreserved region includes a region corresponding to the common electrode line connection portion. The photoresist partially-reserved region includes a region other than the photoresist fully-reserved region and the photoresist fully-unreserved region.

The common electrode line connection portion formed in Step S123 is configured to connect the common electrode to the common electrode line. The common electrode line is formed in a plane identical to the pixel electrode and formed simultaneously with the pixel electrode.

Step S124 is to remove the gate insulation thin film, the active layer thin film and the source-drain metal thin film at the photoresist fully-unreserved region by an etching process.

Step S125 is to remove the photoresist at the photoresist partially-reserved region by an ashing process.

Step S126 is to remove the source-drain metal thin film and the active layer thin film at the photoresist partially-reserved region by an etching process, so as to form the gate insulation layer.

Step S127 is to peel off the photoresist at the photoresist fully-reserved region, so as to expose the source-drain metal layer and the active layer.

In the source-drain metal layer formed in some embodiments of the present disclosure, the source-drain metal layer covers completely a channel between the source and the drain electrodes, i.e., the channel between the source and the drain electrodes has not been formed, so that the channel may be protected in the subsequent step of forming the pixel electrode by an etching process.

In the embodiment hereinabove, a bottom-gate type TFT array substrate is taken as an example to illustrate the method in some embodiments of the present disclosure. Of course, the step of forming the pixel electrode and the passivation layer by one pattering process is also applicable to a top-gate type TFT array substrate.

From the above, in Step S1, the gate electrode, the common electrode, the gate insulation layer, the active layer and the source-drain metal layer may be formed by merely two patterning processes, i.e., according to the method for manufacturing the TFT array substrate in some embodiments of the present disclosure, the TFT array substrate may be formed by merely three patterning processes, thereby reducing the number of the masks and making the process simple and easy to be controlled.

The method of forming the TFT array substrate by three patterning processes will be described hereinafter and may include the following steps.

Step S31 is to form, on a substrate, a gate electrode, a common electrode, and a common electrode line connection portion by one patterning process.

Step S32 is to form, on the resultant substrate, a gate insulation layer, an active layer and a source-drain metal layer by one patterning process.

Step S33 is to form, on the resultant substrate, a pixel electrode, a common electrode line, source and drain electrodes and a passivation layer.

Referring to FIG. 1-1 to FIG. 1-7, the Step S31 further includes the following steps.

Step S311 is to form, on a substrate 101, a first transparent conductive thin film 201, a gate metal thin film 202 and a second transparent conductive thin film 203 in sequence. The first transparent conductive thin film 201 and the second transparent conductive thin film 203 may be ITO or IZO conductive thin films.

Step S312 is to coat photoresist 204 onto the second transparent conductive thin film 203.

Step S313 is to expose and develop the photoresist by a grey tone mask plate or a half tone mask plate, so as to form a photoresist fully-reserved region 2041, a photoresist partially-reserved region 2042 and a photoresist fully-unreserved region 2043. The photoresist fully-reserved region 2041 includes a region corresponding to the gate electrode and the common electrode line connection portion. The photoresist partially-reserved region 2042 includes a region corresponding to the common electrode. The photoresist fully-unreserved region 2043 includes a region other than the photoresist fully-reserved region 2041 and the photoresist partially-reserved region 2042.

Step S314 is to remove the first transparent conductive thin film 201, the gate metal thin film 202 and the second transparent conductive thin film 203 at the photoresist fully-unreserved region 2043 by an etching process.

Step S315 is to remove the photoresist at the photoresist partially-reserved region 2042 by an ashing process.

Step S316 is to remove the gate metal thin film 202 and the second transparent conductive thin film 203 at the photoresist partially-reserved region 2042 by an etching process, so as to form the common electrode 102.

Step S317 is to peel off the photoresist at the photoresist fully-reserved region 2041, so as to expose the gate electrode 103 and the common electrode line connection portion 104.

Referring to FIG. 2-1 to FIG. 2-7, the Step S32 further includes the following steps.

Step S321 is to form a gate insulation thin film 301, an active layer thin film 302 and a source-drain metal thin film 303 in sequence.

Step S322 is to coat photoresist 304 onto the source-drain metal thin film 303.

Step S323 is to expose and develop the photoresist by a grey tone mask plate or a half tone mask plate, so as to form a photoresist fully-reserved region 3041, a photoresist partially-reserved region 3042 and a photoresist fully-unreserved region 3043. The photoresist fully-reserved region 3041 includes a region corresponding to the active layer. The photoresist fully-unreserved region 3043 includes a region corresponding to the common electrode line connection portion. The photoresist partially-reserved region 3042 includes a region other than the photoresist fully-reserved region 3041 and the photoresist fully-unreserved region 3043.

Step S324 is to remove the gate insulation thin film 301, the active layer thin film 302 and the source-drain metal thin film 303 at the photoresist fully-unreserved region 3043 by an etching process.

Step S325 is to remove the photoresist at the photoresist partially-reserved region 3042 by an ashing process.

Step S326 is to remove the source-drain metal thin film 303 and the active layer thin film 302 at the photoresist partially-reserved region 3042 by an etching process, so as to form the gate insulation layer 105.

Step S327 is to peel off the photoresist at the photoresist fully-reserved region 3041, so as to expose the source-drain metal layer 107 and the active layer 106.

Referring to FIG. 3-1 to FIG. 3-7, the Step S33 further includes the following steps.

Step S331 is to form a third transparent conductive thin film 104. The third transparent conductive thin film 104 may be an indium tin oxide (ITO) or an indium zinc oxide (IZO) conductive thin film.

Step S332 is to coat photoresist 402 onto the third transparent conductive thin film 401.

Step S333 is to expose and develop the photoresist 402 by a common mask plate, so as to form a photoresist fully-reserved region 4021 and a photoresist fully-unreserved region 4022. The photoresist fully-reserved region 4021 includes a region corresponding to the pixel electrode, the common electrode line and the source and drain electrodes. The photoresist fully-unreserved region 4022 includes a region corresponding to a channel between the source and the drain electrode and the passivation layer.

Step S334 is to etch the third transparent conductive thin film 401 at the photoresist fully-unreserved region 4022, so as to form the pixel electrode 108, the common electrode line 109 and a source electrode protective portion 110.

Step S335 is to etch the source-drain metal layer 107 at the photoresist fully-unreserved region 4022, so as to form the source electrode 1071 and the drain electrode 1072.

Step S336 is to form a passivation layer thin film 403.

Step S337 is to peel off the photoresist at the photoresist fully-reserved region 4021, so as to form the passivation layer 111.

Figures 1, 2, 3, 4:
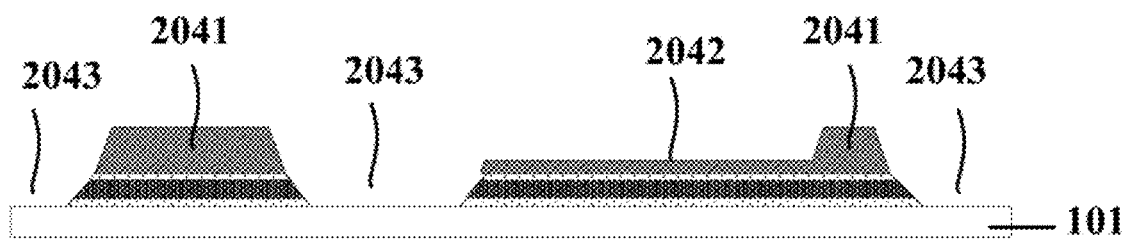
Figures 1, 2, 3, 4, 5:
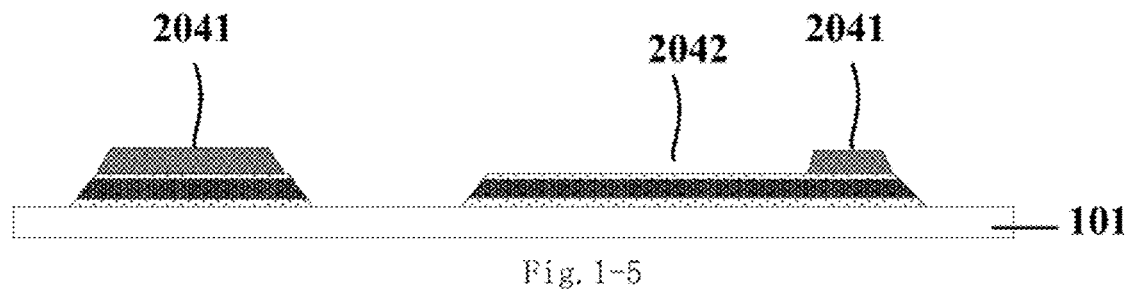
Figures 1, 2, 3, 4, 5, 6:
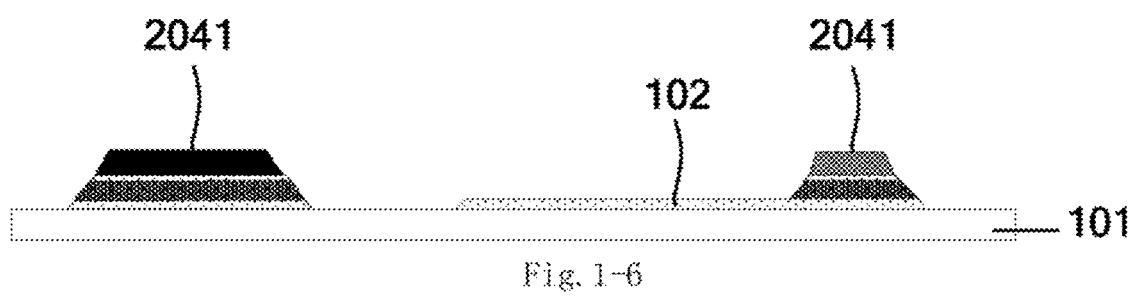
Figures 1, 2, 3, 4, 5, 6, 7:
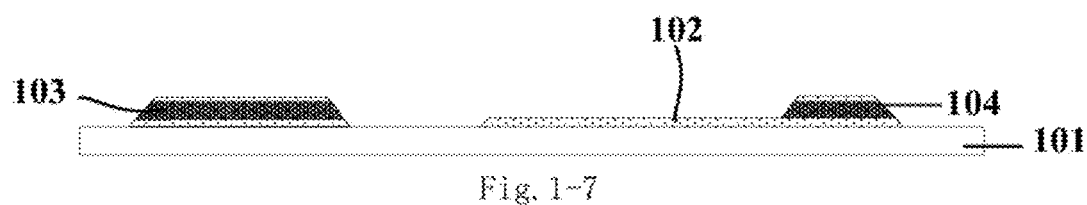
Figures 1, 2:
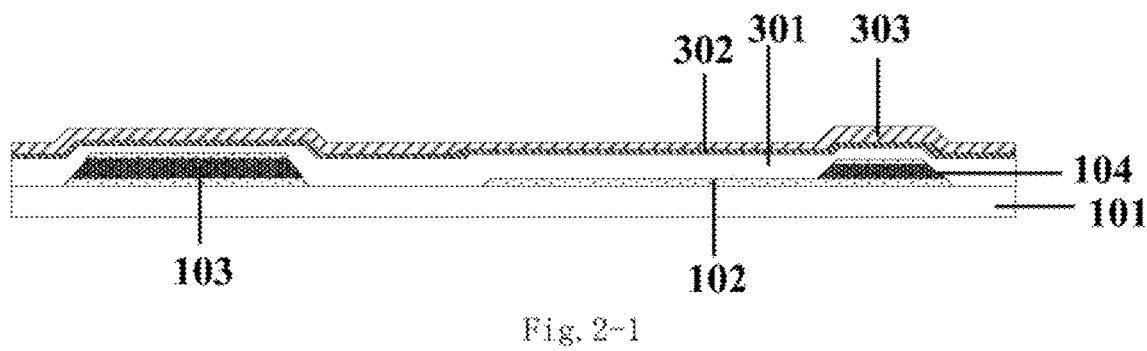
Figure 2:
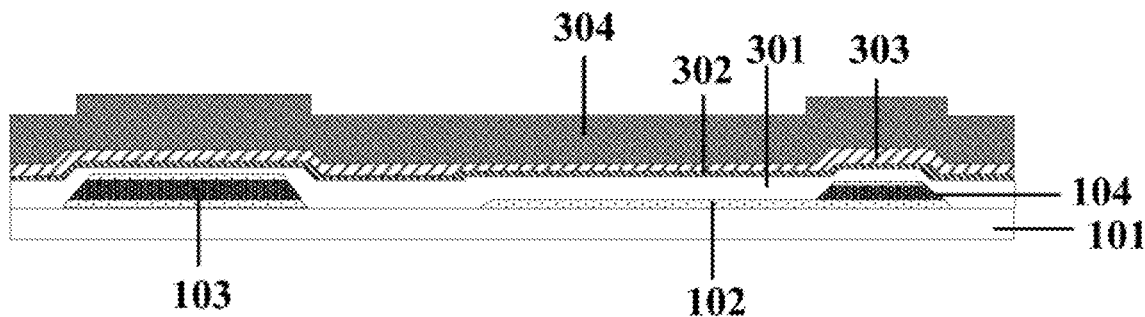
Figures 2, 3:
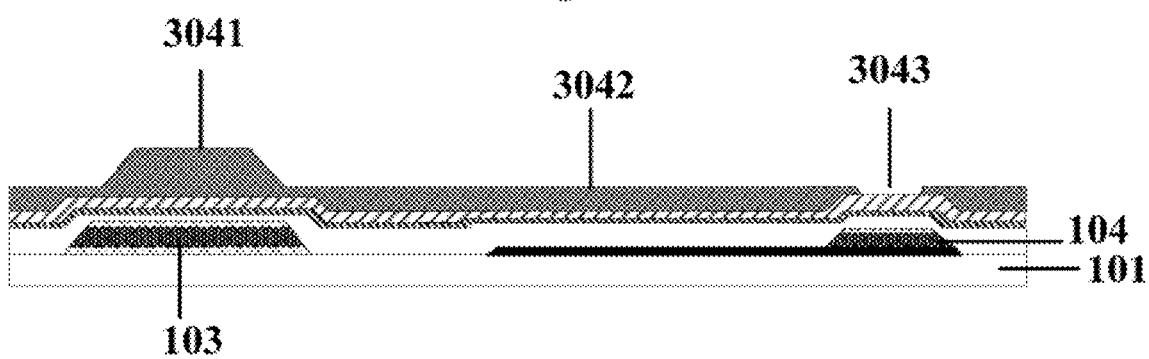
Figures 2, 3, 4:
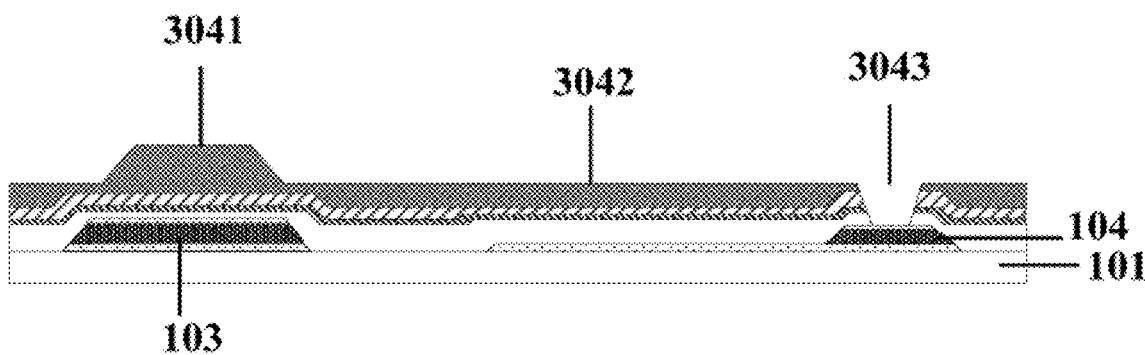
Figures 2, 3, 4, 5:
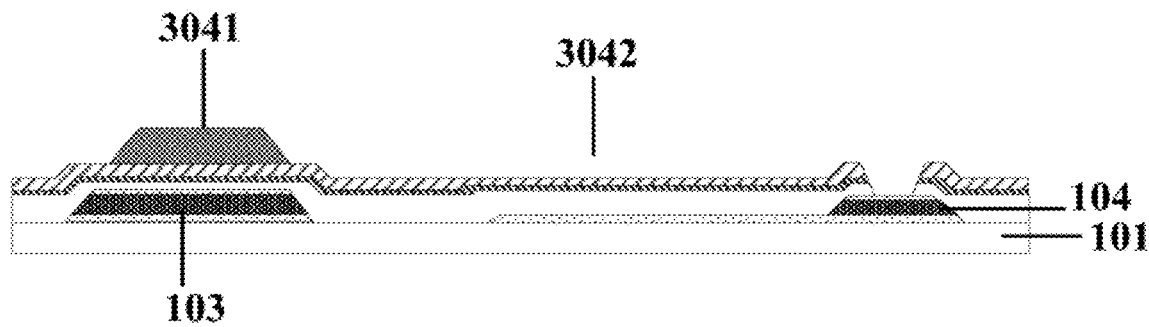
Figures 2, 3, 4, 5, 6:
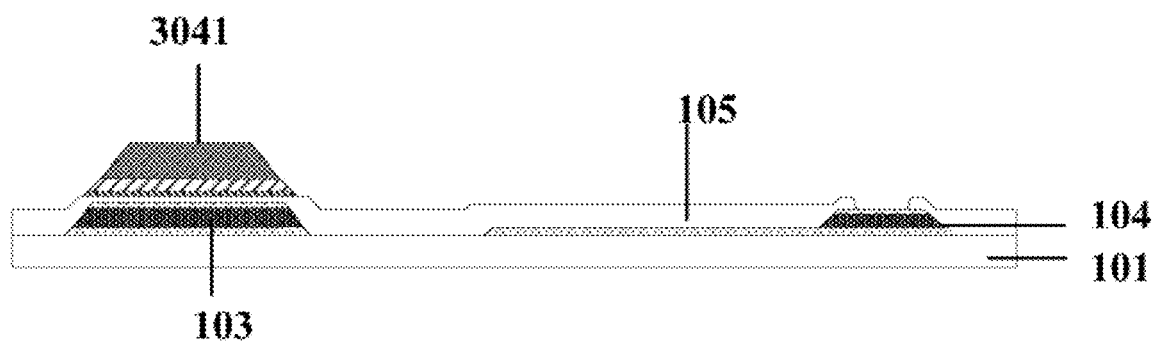
Figures 2, 3, 4, 5, 6, 7:
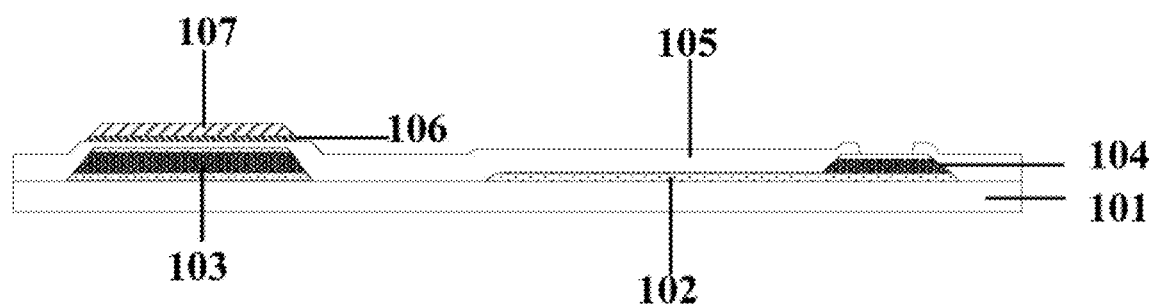
Figures 1, 3:
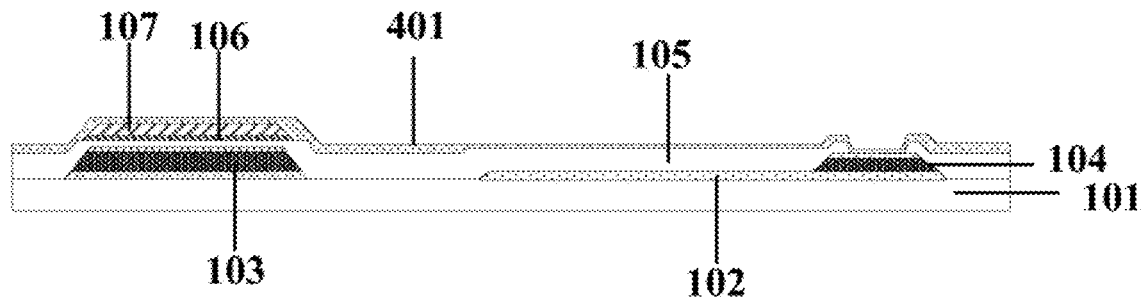
Figures 2, 3:
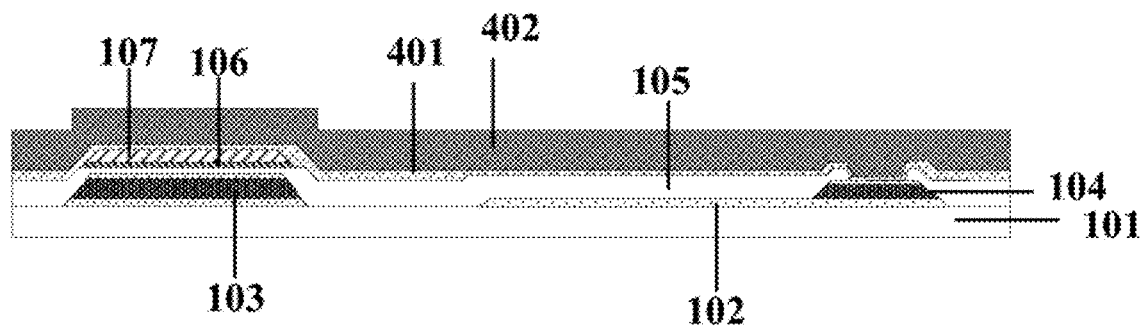
Figure 3:
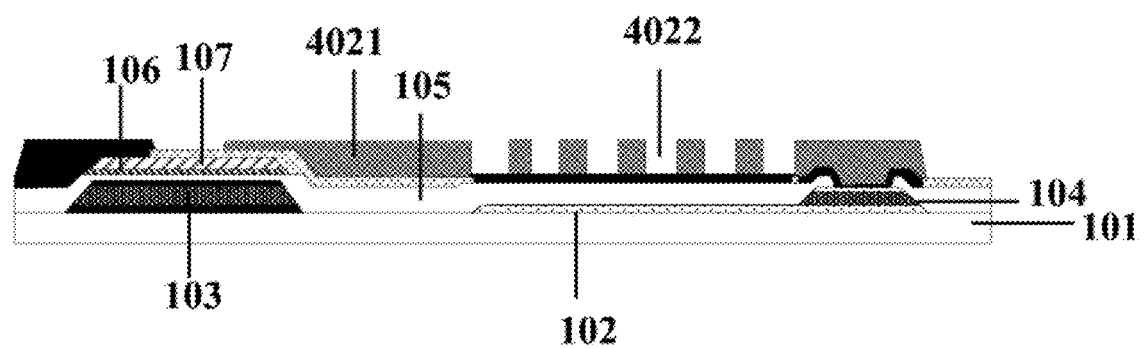
Figures 3, 4:
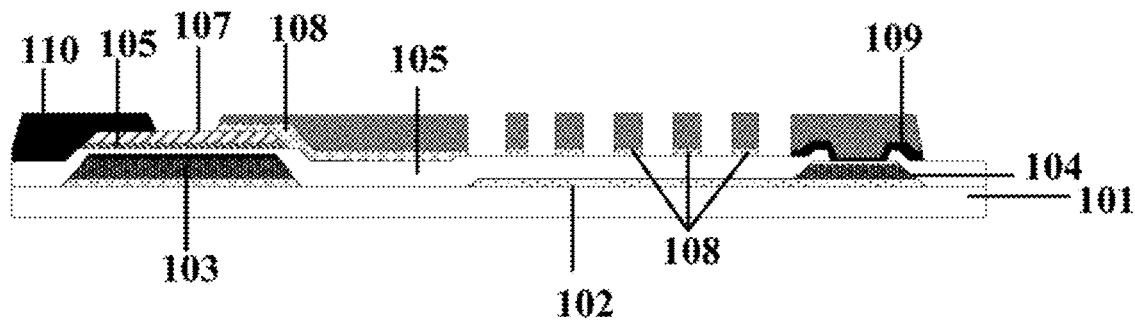
Figures 3, 4, 5:
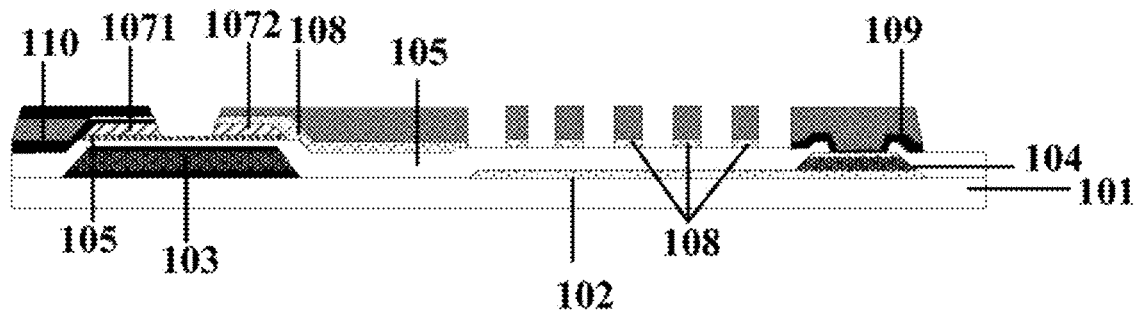
Figures 3, 4, 5, 6:
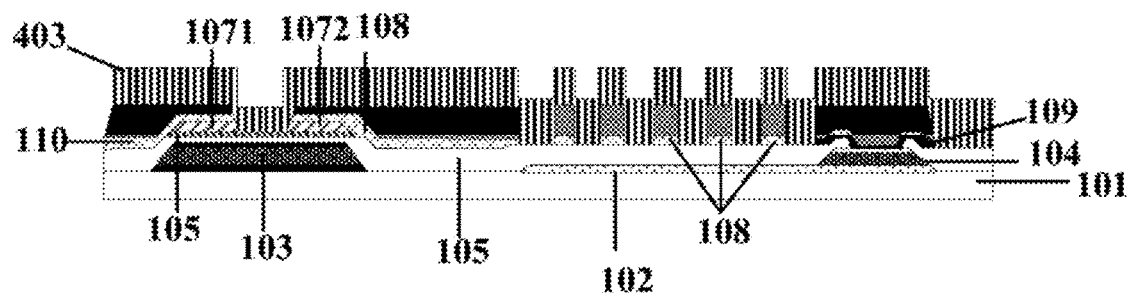
Figures 3, 4, 5, 6, 7:
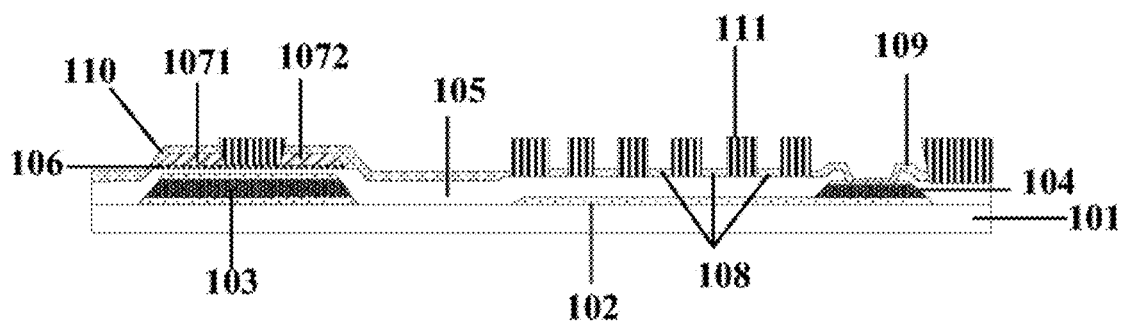
Figure 4:
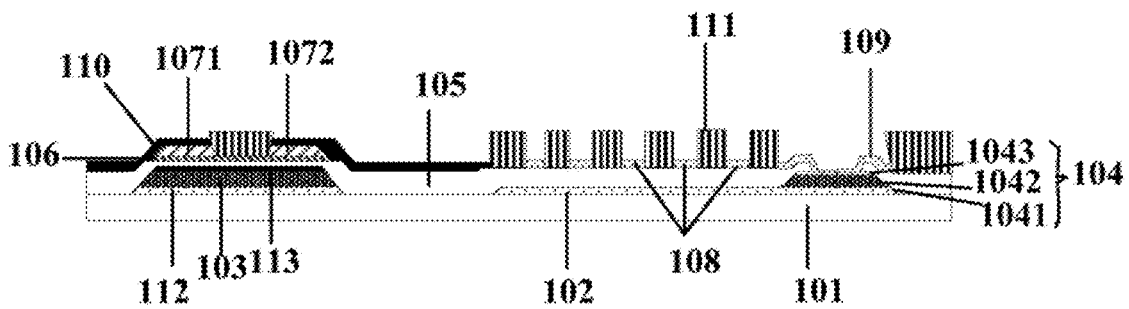

As shown in FIG. 4, a TFT array substrate is further provided in some embodiments of the present disclosure, including:

a substrate 101, and a gate electrode 103, a common electrode 102, a gate insulation layer 105, an active layer 106, a source electrode 1071 and a drain electrode 1072 arranged on the substrate 101;

a pixel electrode 108 arranged on the gate insulation layer 105 and overlapped with and jointed to the drain electrode 1072; and a passivation layer 111 arranged on the gate insulation layer 105 and a channel between the source electrode 1071 and the drain electrode 1072.

Optionally, the TFT array substrate further includes: a common electrode line 109, arranged at a layer and made of a material identical to the pixel electrode 108.

That is, the pixel electrode 108 and the common electrode line 109 are formed on the same plane, and thus it is easy to achieve the lap joints of the pixel electrode 102 and the common electrode 108 when the bright points occur, so as to turn the bright points into dark points.

Optionally, the TFT array substrate further includes:
the gate electrode 103, arranged on the substrate 101;
the common electrode 102, arranged on the substrate 101.

The thin film transistor array substrate further includes:
a transparent conductive thin film protective portion 112, arranged between the gate electrode 103 and the substrate 101 and arranged at a layer and made of a material identical to the common electrode 102;

a common electrode line connection portion 104, arranged on the common electrode 102 and including a first transparent conductive layer 1041 and a gate metal layer 1042, where the common electrode 102 is connected to the corresponding common electrode line 109 via the common electrode line connection portion 104.

Optionally, the TFT array substrate further includes: a gate electrode protective layer 113, arranged between the gate electrode 103 and the gate insulation layer 105.

The common electrode line connection portion 104 further includes a second transparent conductive layer 1043 arranged at a layer and made of a material identical to the gate electrode protective layer 113.

Optionally, the TFT array substrate further includes: a source electrode protective portion 110 arrange on the source electrode 1071 and arranged at a layer and made of a material identical to the pixel electrode 108.

A display device is further provided in some embodiments of the present disclosure, including the TFT array substrate hereinabove.

The above are merely the optional embodiments of the present disclosure. A person skilled in the art may make further modifications and improvements without departing from the principle of the present disclosure, and these modifications and improvements shall also fall within the scope of the present disclosure.

What is claimed is:

1. A thin film transistor (TFT) array substrate, comprising: a substrate, and a gate electrode, a common electrode, a gate insulation layer, an active layer, a source electrode and a drain electrode arranged on the substrate, wherein the TFT array substrate further comprises:
   a pixel electrode, arranged on the gate insulation layer, overlapped with and jointed to the drain electrode;
   a passivation layer, arranged on the gate insulation layer and a channel between the source and drain electrodes; and
   a common electrode line, arranged in a layer different from the common electrode and arranged on a plane identical to the pixel electrode.

2. The TFT array substrate according to claim 1, wherein the common electrode line is made of a same material as the pixel electrode.

3. The TFT array substrate according to claim 2, further comprising:
   a transparent conductive thin film protective portion, arranged between the gate electrode and the substrate, wherein the transparent conductive thin film protective portion is arranged at a same layer and made of a same material as the common electrode;
   a common electrode line connection portion, arranged on the common electrode and comprising a first transparent conductive layer and a gate metal layer, wherein the common electrode is connected to the common electrode line via the common electrode line connection portion.

4. The TFT array substrate according to claim 3, further comprising:
   a gate electrode protective layer, arranged between the gate electrode and the gate insulation layer;
   wherein the common electrode line connection portion further comprises a second transparent conductive layer arranged at a same layer and made of a same material as the gate electrode protective layer.

5. The TFT array substrate according to claim 2, further comprising:
   a source electrode protective portion covering the source electrode and arranged at a same layer and made of a same material as the pixel electrodes.

6. A display device, comprising:
   a thin film transistor (TFT) array substrate;
   wherein the thin film transistor array substrate comprises:
   a substrate, and a gate electrode, a common electrode, a gate insulation layer, an active layer, a source electrode and a drain electrode arranged on the substrate, wherein the TFT array substrate further comprises:
   a pixel electrode, arranged on the gate insulation layer, overlapped with and jointed to the drain electrode;
   a passivation layer, arranged on the gate insulation layer and a channel between the source and drain electrodes; and
   a common electrode line, arranged in a layer different from the common electrode and arranged on a plane identical to the pixel electrode.

7. The display device according to claim 6, wherein the common electrode line is made of a same material as the pixel electrode.

8. The display device according to claim 7, wherein the TFT array substrate further comprises:
   a transparent conductive thin film protective portion, arranged between the gate electrode and the substrate, wherein the transparent conductive thin film protective portion is arranged at a same layer and made of a same material as the common electrode;
   a common electrode line connection portion, arranged on the common electrode and comprising a first transparent conductive layer and a gate metal layer, wherein the common electrode is connected to the common electrode line via the common electrode line connection portion.

9. The display device according to claim 8, wherein the TFT array substrate further comprises:
   a gate electrode protective layer, arranged between the gate electrode and the gate insulation layer;
   wherein the common electrode line connection portion further comprises a second transparent conductive layer arranged at a same layer and made of a same material as the gate electrode protective layer.

10. The display device according to claim 7, wherein the TFT array substrate further comprises:
    a source electrode protective portion covering the source electrode and arranged at a same layer and made of a same material as the pixel electrodes.

* * * * *